(12) United States Patent
Martin et al.

(10) Patent No.: US 7,821,084 B2
(45) Date of Patent: *Oct. 26, 2010

(54) SENSOR SYSTEM

(75) Inventors: John R. Martin, Foxborough, MA (US); Timothy J. Brosnihan, Natick, MA (US); Michael W. Judy, Ipswich, MA (US); Xin Zhang, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 445 days.

This patent is subject to a terminal disclaimer.

(21) Appl. No.: 11/952,404

(22) Filed: Dec. 7, 2007

(65) Prior Publication Data

US 2008/0087086 A1  Apr. 17, 2008

Related U.S. Application Data

(63) Continuation of application No. 11/058,483, filed on Feb. 15, 2005, now Pat. No. 7,327,003.

(51) Int. Cl.
*H01L 29/84* (2006.01)

(52) U.S. Cl. .............................. 257/415; 257/E29.324

(58) Field of Classification Search ................ 257/415, 257/E21.002, E29.166; 438/51; 73/514.32
See application file for complete search history.

(56) References Cited

U.S. PATENT DOCUMENTS

| 3,143,883 | A  | * | 8/1964  | Nakasone    | 73/735    |
| 5,369,544 | A  |   | 11/1994 | Mastrangelo | 361/283.4 |
| 5,939,633 | A  |   | 8/1999  | Judy        | 73/514.32 |
| 6,159,761 | A  |   | 12/2000 | Okada       | 438/53    |
| 7,327,003 | B2 | * | 2/2008  | Martin et al. | 257/414 |
| 2006/0148133 | A1 |   | 7/2006 | Nunan et al. | 438/117 |

* cited by examiner

*Primary Examiner*—Evan Pert
(74) *Attorney, Agent, or Firm*—Sunstein Kann Murphy & Timbers LLP

(57) ABSTRACT

Rather than increasing the mass of the structure, the structure in a sensor system suspends its substrate from some mechanical ground. Motion of the substrate relative to the mechanical ground thus provides the movement information. To those ends, the sensor system includes a base, a substrate, and a flexible member suspended from at least a portion of the substrate. At least a portion of the flexible member is capable of moving relative to at least a portion of the substrate. In addition, the flexible member is secured to the base, thus causing the substrate to be movable relative to the base. Moreover, the mass of the substrate is greater than the mass of the flexible member. The substrate and flexible member are configured to interact to produce a motion signal identifying movement of the base.

24 Claims, 12 Drawing Sheets

SENSOR SYSTEM

This is a continuation of U.S. patent application Ser. No. 11/058,483, filed Feb. 15, 2005, now U.S. Pat. No. 7,327,003, the full disclosure of which is hereby incorporated by reference herein.

FIELD OF THE INVENTION

The invention generally relates to sensor systems and, more particularly, the invention relates to sensor systems having movable structure.

BACKGROUND OF THE INVENTION

Microelectromechanical systems ("MEMS," hereinafter "MEMS devices") are used in a wide variety of applications. For example, MEMS devices currently are implemented as microphones to convert audible signals to electrical signals, as gyroscopes to detect pitch angles of airplanes, and as accelerometers to selectively deploy air bags in automobiles. In simplified terms, such MEMS devices typically have a movable structure suspended above a substrate, and associated electronics that both senses movement of the suspended structure and delivers the sensed movement data to one or more external devices (e.g., an external computer). The external device processes the sensed data to calculate the property being measured (e.g., pitch angle or acceleration).

As their name suggests, MEMS devices are very small. Consistent with this goal, the movable structure in a MEMS device has a very small mass. For example, the mass of the movable structure may be on the order of one microgram. Such small structure, when implemented in an accelerometer, produces small inertial forces. When subjected to an acceleration, the resulting displacement may be insufficient to detect unless the structure is held with very compliant springs. Very compliant springs, however, are fragile and may not provide enough return force if the structure contacts other internal components (i.e., the structure is more susceptible to stiction problems).

On solution to this problem is to increase the mass of the structure relative to the substrate. Of course, increasing the size of the structure is inconsistent with the goals of MEMS devices; namely, reducing the overall size of the final device.

SUMMARY OF THE INVENTION

In accordance with one aspect of the invention, rather than increasing the mass of the structure, the structure in a sensor system suspends its substrate from some mechanical ground. Motion of the substrate relative to the mechanical ground thus provides the movement information. To those ends, the sensor system includes a base, a substrate, and a flexible member suspended from at least a portion of the substrate. At least a portion of the flexible member is capable of moving relative to at least a portion of the substrate. A portion of the flexible member, however, may be rigid. In addition, the flexible member is secured to the base, thus causing the substrate to be movable relative to the base. Moreover, the mass of the substrate is greater than the mass of the flexible member. The substrate and flexible member are configured to interact to produce a motion signal identifying movement of the base.

In illustrative embodiments, a portion of the flexible member is capable of moving relative to the base. In addition, the substrate may include an in-situ cap, and/or the base may be an integrated circuit chip, a circuit board, or a package. To provide additional functionality on a single die, the substrate may have circuitry for detecting motion of the substrate relative to the base. Among other ways, a conductive boss may be used to couple the flexible member to the base.

The substrate may have a conductor that cooperates with the flexible member to form a varying capacitor. At least a portion of the flexible member may be conductive. The capacitance of the varying capacitor changes as the substrate moves relative to the flexible member. In addition, the sensor system may have circuitry for converting changes in the varying capacitance to a signal identifying movement of the base.

The sensor system may have a plurality of additional flexible members suspended from the substrate. The additional flexible members each may have an additional flexible member mass. In illustrative embodiments, the sum total of the flexible member mass and all additional flexible member masses is less than the substrate mass.

In accordance with other aspects of the invention, a method of producing a sensor system forms a MEMS chip having a flexible member suspended from at least a portion of a substrate. At least a portion of the substrate is capable of moving relative to at least a portion of the flexible member. The mass of the substrate is greater than the mass of the flexible member. The method then couples the flexible member with a base so that the substrate is movable relative to the base.

In illustrative embodiments, the method also forms a mounting member on the flexible member surface facing the base. The method thus may couple the flexible member with the base by securing the mounting member to the base. Moreover, the flexible member may be suspended by processes that use polysilicon as a sacrificial material. In addition, the method may form circuitry on the substrate before suspending the flexible member from at least a portion of the substrate.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments of the invention, a sensor system movably suspends the substrate of a MEMS chip above a base (e.g., an integrated circuit chip, a package, or a circuit board). Accordingly, rather than monitoring movement of its movable structure (i.e., the portion suspended from the substrate), the sensor system determines acceleration by monitoring movement of the substantial majority of the MEMS chip mass. When compared to prior art MEMS chips of the same size (i.e., those that monitor the suspended portion), this system may have less compliant springs while delivering comparable sensitivity. Less compliant springs, however, typically are more robust. Consequently, the sensor system should be more durable than those of similarly sized MEMS chips and have fewer stiction problems. Alternatively, if desired, the sensor system may have more compliant springs to provide more sensitivity. Even in this latter case, however, the sensor system still should provide the noted benefits of a larger effective movable structure without increasing overall die size. In fact, the die size could be reduced and still should produce satisfactory results. Details of various embodiments are discussed below.

Figure 1:
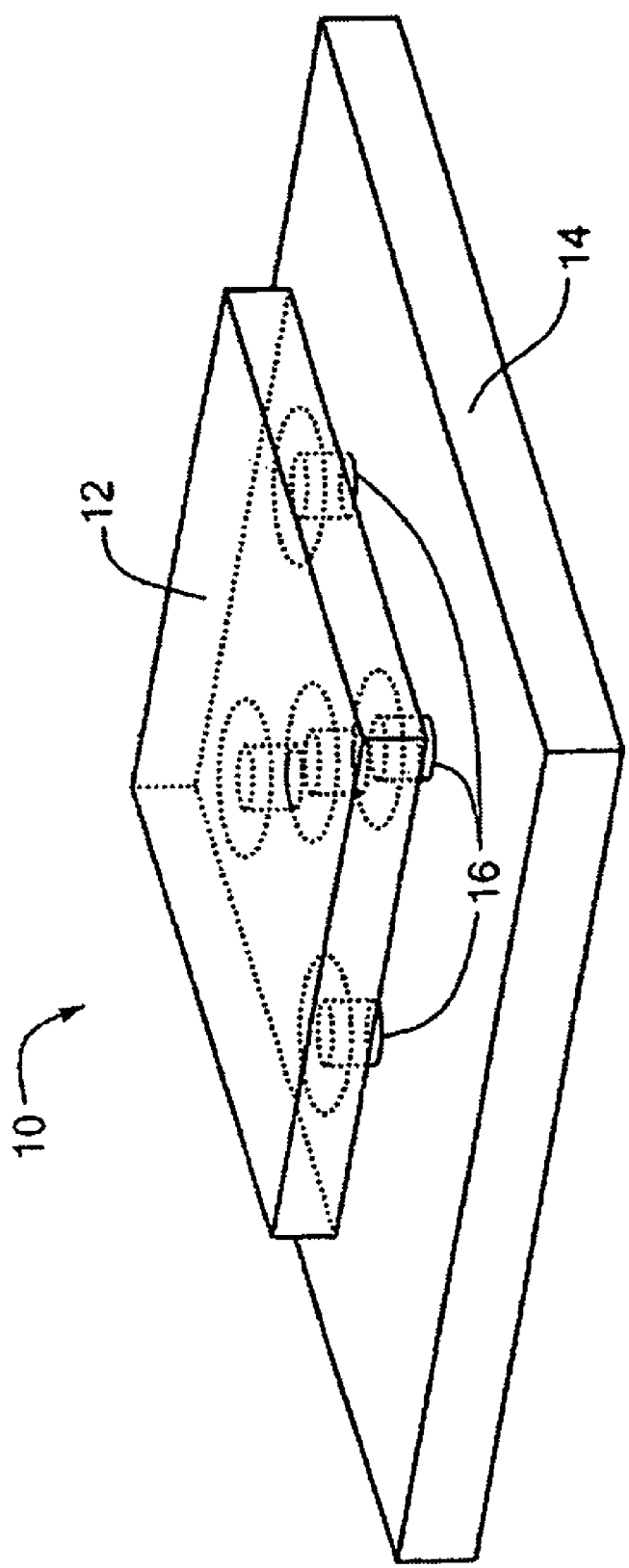
FIG. 1 schematically shows a generic sensor system that may be produced in accordance with illustrative embodiments of the invention.

FIG. 1 schematically shows a generic sensor system 10 that may be produced in accordance with illustrative embodiments of the invention. The sensor system 10 may sense one or more of any number of physical phenomena. Among others, those phenomena may include acceleration, rotational movement, audible signals, pressure, etc. . . . Accordingly, the sensor system 10 may implement the functionality of an accelerometer, gyroscope, microphone, and/or pressure sensor. For simplicity, however, this discussion focuses primarily upon an accelerometer. It nevertheless should be understood that although an accelerometer is discussed, principles of various embodiments can apply to other types of sensor systems.

The sensor system 10 in FIG. 1 includes a MEMS chip 12 (also referred to as a "MEMS die 12") mounted to a mechanical grounding apparatus (referred to herein as a "base 14"). For example, the base 14 may be as a circuit board, circuit chip, or a package. Discussion of those exemplary bases, however, are for illustrative purposes and not intended to limit the scope of various embodiments. Other bases may be used.

As noted above, the MEMS chip 12 is mounted to the base 14 in a manner that suspends the majority of the chip mass above the base 14. To that end, the MEMS chip 12 has a plurality of bosses 16 that mechanically secure the MEMS chip 12 to the base 14. The bosses 16 illustratively are metalized to provide an electrical connection between the base 14 and the MEMS chip 12. In alternative embodiments, however, the bosses 16 are not metalized and thus, the system 10 may use some other means for electrically connecting the base 14 and MEMS chip 12 (e.g., wire bonds).

Rather than use bosses 16, the MEMS chip 12 may have some other support for spacing its substrate from the base 14. For example, solder balls may be used to space the substrate from the base 14. It is anticipated, however, that polysilicon bosses 16 would provide a more robust support platform than solder balls. Solder balls are relatively soft and can deteriorate more readily than polysilicon. In a manner similar to the bosses 16, the other support types may or may not provide an electrical connection between the base 14 and the MEMS chip 12.

Figure 2:
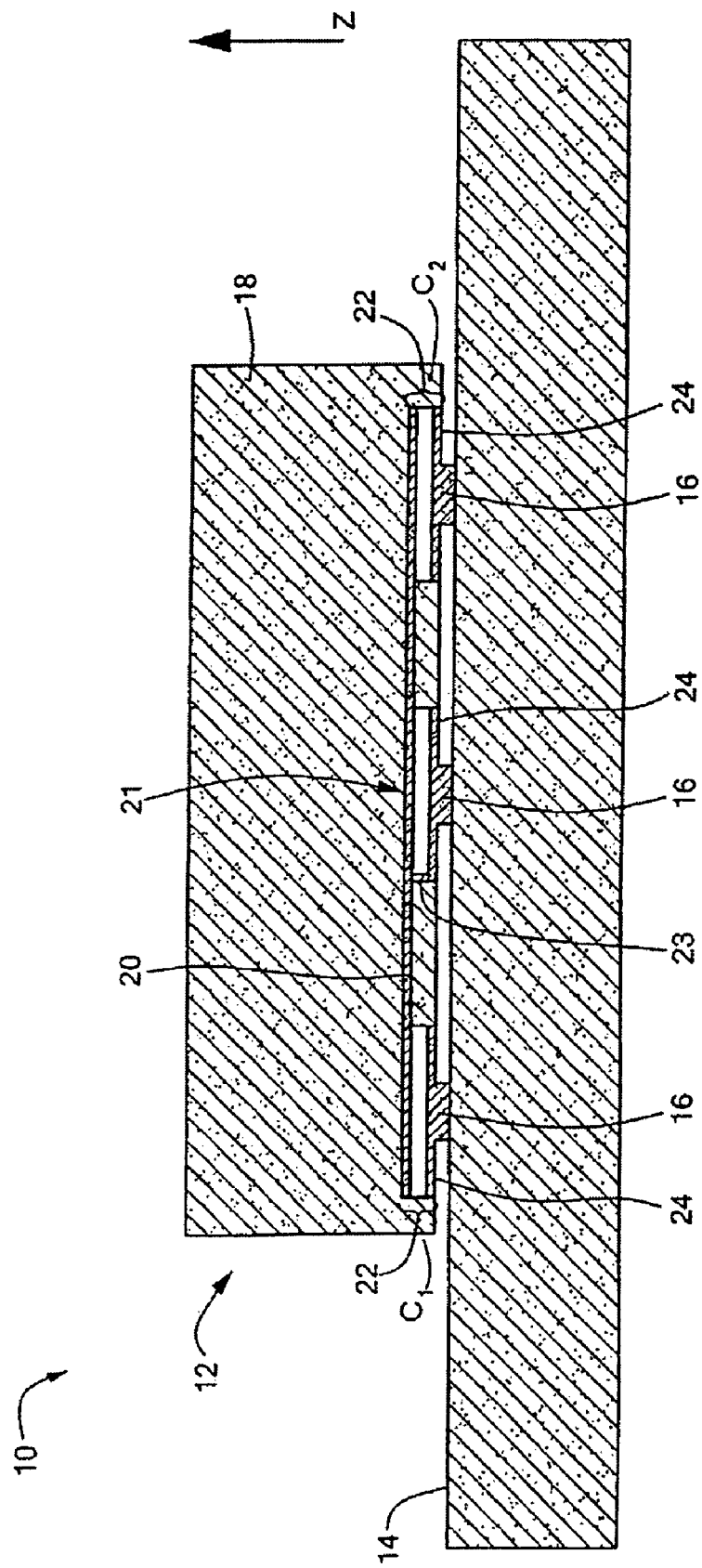
FIG. 2 schematically shows a cross-sectional view of one embodiment of the sensor system shown in FIG. 1.

FIG. 2 schematically shows a cross-sectional view of one embodiment of the sensor system 10 shown in FIG. 1. This view also is partially cut away to show additional components of the MEMS chip 12. In this embodiment, the base 14 is a circuit die or application specific integrated circuit ("ASIC") having some desired functionality. Continuing with the accelerometer example, the base 14 has accelerometer circuitry for producing a signal representing the positive or negative acceleration of the base 14. For example, the base 14 may have circuitry for converting a variable capacitance (discussed below) to a digital signal, and standard transmit circuitry for forwarding such signal to an external device. Alternatively, the circuitry may be distributed across the base 14 and multiple die, including the MEMS chip 12. The MEMS accelerometer circuitry may be conventional circuitry configured for that purpose, such as the circuitry disclosed in U.S. Pat. No. 5,939,633, the disclosure of which is incorporated herein, in its entirety, by reference. Exemplary circuitry may include BI-MOS, CMOS, bipolar junction transistors, or a combination thereof.

Among other things, the MEMS chip 12 shown in FIG. 2 has a substrate 18 with a fixed electrode 20 and an electrical connector 21 to electrically connect the fixed electrode 20 with circuitry on the base 14. Any conventional electrical connector that does not unduly interfere with system performance may be used. In illustrative embodiments, the electrical connector 21 includes a communication boss 16 coupled with a conductive channel 23 that connects with the fixed electrode 20. The conductive channel 23 may include a flexible or inflexible diaphragm 24 (noted below).

The MEMS chip 12 also has a plurality of flexible members 22 for movably supporting the entire MEMS chip 12 on the base 14. In a manner similar to the electrical connector 21, each flexible member 22 is formed from a flexible diaphragm 24 and an integral boss 16 coupled with the base 14. The diaphragm 24 of each flexible member 22 may be considered to have a rigidly constrained stable portion secured to the substrate 18, and a movable portion that is not so constrained. Accordingly, the movable portion of each flexible member 22 is free to move or flex relative to the substrate 18.

In illustrative embodiments, the substrate 18 has a mass that is greater than that of any flexible member 22. In fact, the total mass of all flexible members 22 illustratively is less than that of the substrate 18. This disparity in the masses of the flexible member(s) 22 and the substrate 18 enables many of the benefits discussed.

Figure 3:
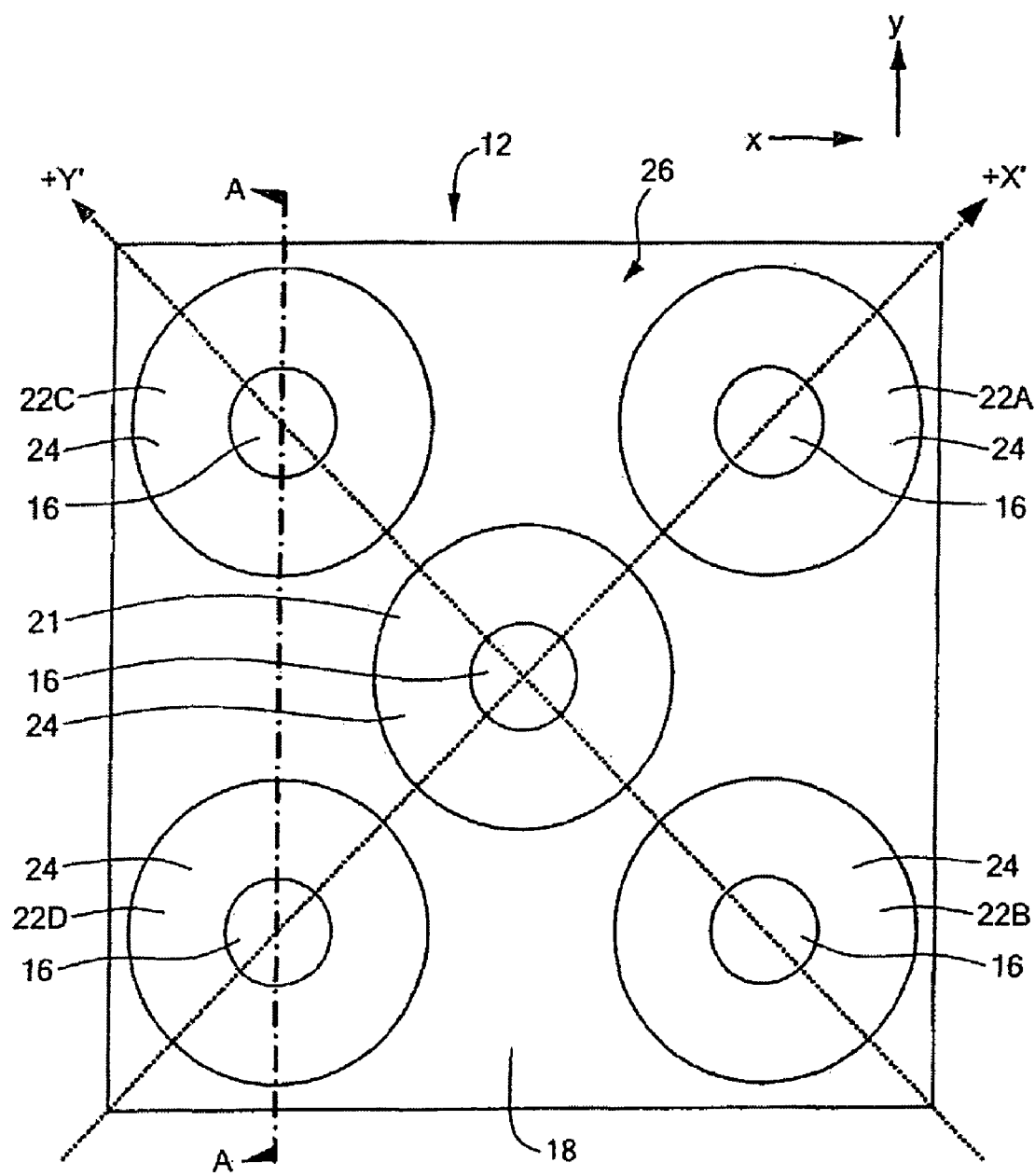
FIG. 3 schematically shows a plan view of the bottom side of the MEMS chip, which contacts the base.

FIG. 3 schematically shows a plan view of the side of the MEMS chip 12 that contacts the base 14. This side is referred to as the "bottom side 26" of the MEMS chip 12. In the embodiments shown, the MEMS chip 12 has four off-center flexible members 22 and a centrally located electrical connector 21. Of course, those skilled in the art should understand that the configuration and number of flexible members 22 shown in FIG. 3 is exemplary and thus, not intended to limit the scope of various embodiments.

In accordance with illustrative embodiments, the movable portions of the plurality of flexible members 22 enable the sensor system 10 to detect substrate movement. To that end, each of the plurality of flexible members 22 forms a separate variable capacitor with the fixed electrode 20. Two of those variable capacitors are schematically shown in FIG. 2 as capacitor C1 and capacitor C2. Acceleration of the substrate 18 thus causes the movable portions of at least one of the flexible members 22 to move relative to the fixed electrode 20. This movement consequently changes the capacitance within at least one of the plurality of variable capacitors. Circuitry on the base 14 detects this capacitance change and responsively generates a digital or analog signal representing the sensed acceleration. The circuitry then may forward this digital signal to some external or internal device for further processing. For example, the digital signal may be forwarded to a computer in an automobile, which responsively deploys airbags.

In alternative embodiments, the base 14 and substrate 18 together cooperate to form a variable capacitor for the same purposes as discussed above. To those ends, some embodiments may form corresponding electrodes on the base 14 in the substrate 18. Such electrodes may or may not be hermetically sealed. Signals to and from the substrate electrodes could be through the bosses 16. Still other embodiments may form corresponding electrodes on the base 14 and flexible members 24 for the same purposes.

The accelerometer may be implemented as a one, two, or three dimensional accelerometer. Methods of calculating movement along any of the three orthogonal axes (i.e., along the X-axis, Y-axis, or Z-axis) can vary. Specifically, movement in the Z-direction (i.e., normal to the top face of both the MEMS chip 12 and the base 14) may cause the space between the plates of each variable capacitor to change in a substantially uniform manner. For example, if the acceleration urges the MEMS substrate 18 in the positive Z-direction, then the space between the plates in each variable capacitor should increase. Among other ways, the circuitry in the base 14 may detect this change by averaging the change in capacitance across all variable capacitors. The degree of this change may be converted into a digital signal representing the amount of detected acceleration.

The illustrative sensor system 10 detects acceleration along the X and Y axes in a different manner than that used to detect acceleration along the Z-axis. In particular, because of the off axis mounting of the flexible members 22, the movement along either the X-axis or Y-axis increases the space between the plates in the capacitor on one side of the MEMS chip 12 (i.e., on one side of an effective fulcrum), while decreasing the space between the plates in the capacitor on the other side of the MEMS chip 12. The circuitry in the base 14 thus may detect this change and calculate the net capacitance change by summing the capacitance change of all capacitors on one side of the MEMS chip 12, and then summing the capacitance change of all capacitors on the other side of the MEMS chip 12. The circuitry then may calculate the effective capacitive change by taking the difference between the summed capacitive changes.

A simplified example can illustrate this calculation. If a deceleration along the X-axis shown in FIG. 3 is applied, then the space between the plates of the capacitors formed by flexible members 22A and 22B should decrease. This space change causes a similar capacitance change in each capacitor formed by members 22A and 22B, which the circuitry sums together to produce a first summed capacitance change. Conversely, the space between the plates of the capacitors formed by flexible members 22C and 22D should increase. This space change causes a similar capacitance change in each capacitor formed by capacitors 22C and 22D, which the circuitry sums also together to produce a second summed capacitance change. The circuitry then may take the difference of the first and second summed capacitance changes to determine the aggregate capacitance change. This aggregate capacitance change represents the noted deceleration, which the circuitry then converts into a digital signal.

In alternative embodiments, the accelerometer is mounted to the base 14 so that the axis X' is aligned with the X-axis. This alignment should reduce the total number of computations required to determine acceleration in the X and Y directions.

Figure 4:
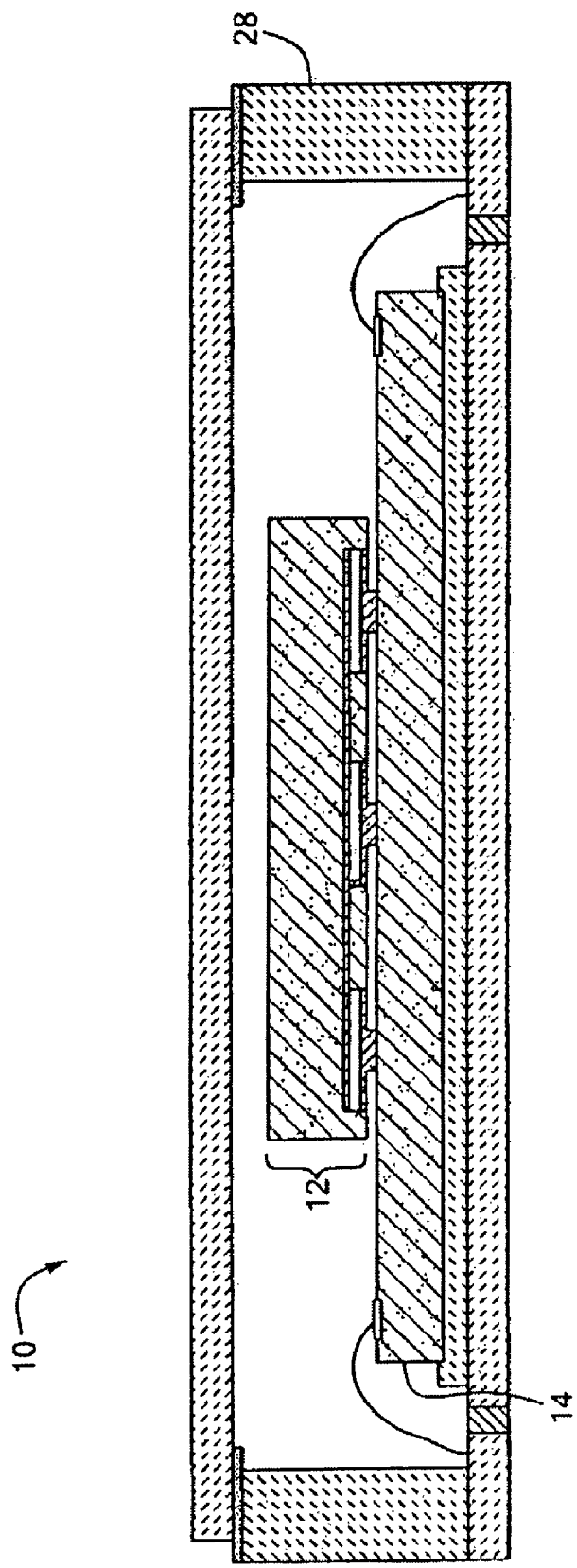
FIG. 4 schematically shows the sensor system shown in FIG. 2 mounted within a package.

FIG. 4 schematically shows the sensor system 10 of FIG. 2 mounted within a package 28. In illustrative embodiments, the package 28 is a pre-molded cavity package, which is formed from a leadframe partially encapsulated by plastic. The plastic may expose portions of the leadframe for electrical communication with the sensor system 10. The premolded package 28 shown has a cavity into which the sensor system 10 is mounted, and a lid to cover the cavity.

As known by those in the art, the premolded package 28 does not provide a hermetic seal. Such a package 28 nevertheless can be used because the structure on the MEMS die is sufficiently capped by a wafer level in-situ cap 30 (discussed below). Packages other than a premolded cavity package 28, however, may be used. For example, metal and ceramic packages also may be used. Accordingly, discussion of a premolded package 28 is exemplary and not intended to limit the scope of various embodiments of the invention. The premolded package 28 has some advantages over metal and ceramic packages, such as lower cost and the ability to increase the speed of the packaging process.

Figure 5:
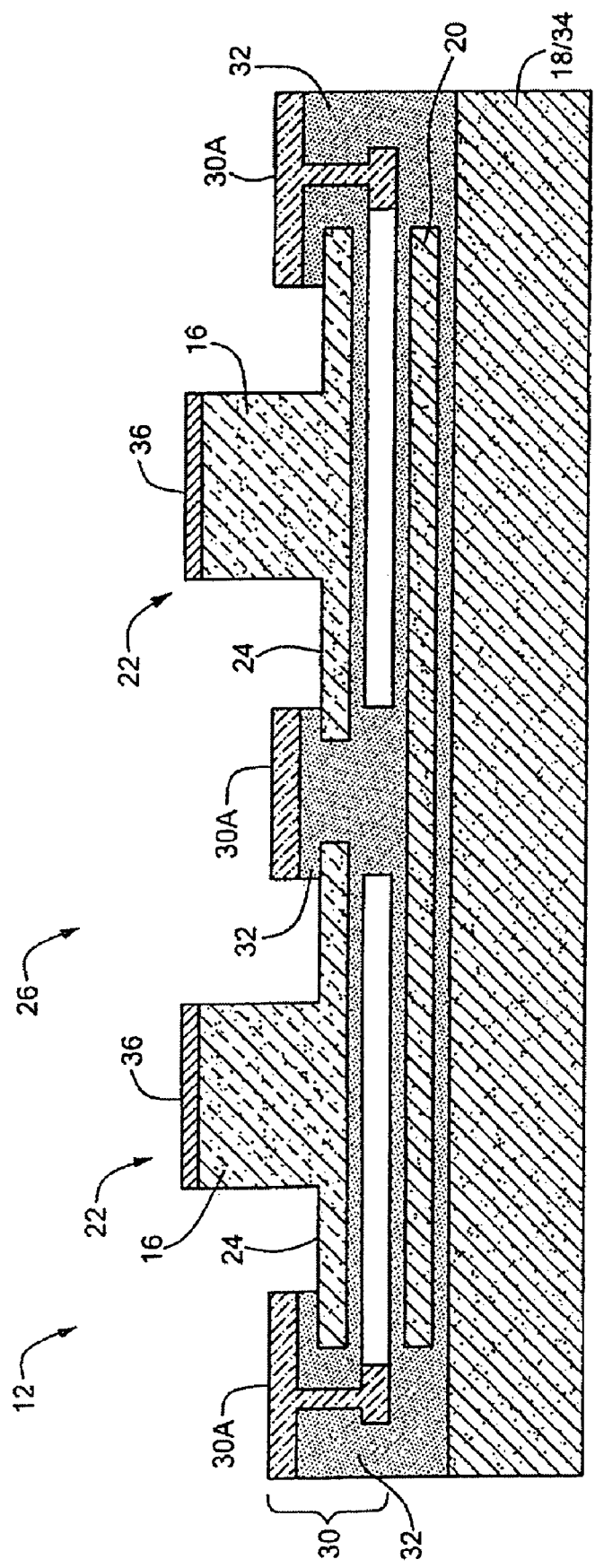
FIG. 5 schematically shows a cross-sectional view of the MEMS chip across line A-A of FIG. 3.

FIG. 5 schematically shows a cross-sectional view of the MEMS chip 12 across line A-A of FIG. 3. Although many of the components in this figure are in other figures, it is included to show more detail of the MEMS chip 12. Specifically, FIG. 5 shows the substrate 18 and its fixed electrode 20, the flexible members 22, and the above noted in-situ cap 30. As clearly shown, the stable portions of the flexible members 22 are constrained within an oxide 32 deposited onto a silicon wafer 34. In addition, among other things, the in-situ cap 30 is formed from the oxide 32, the flexible members 22, bosses 16, and passivation layer 30A. The passivation layer 30A may be comprised of PECVD oxide and nitride films similar to those used on standard semiconductor circuit wafers. As discussed in greater detail below, the passivation layer 30A hermetically seals the space between the fixed electrode 20 and the movable portions of each variable capacitor. FIG. 5 also shows a metalized layer 36 on the top surfaces of the two bosses 16. This metalized layer 36 facilitates an electrical connection with external electronic components.

Figure 6:
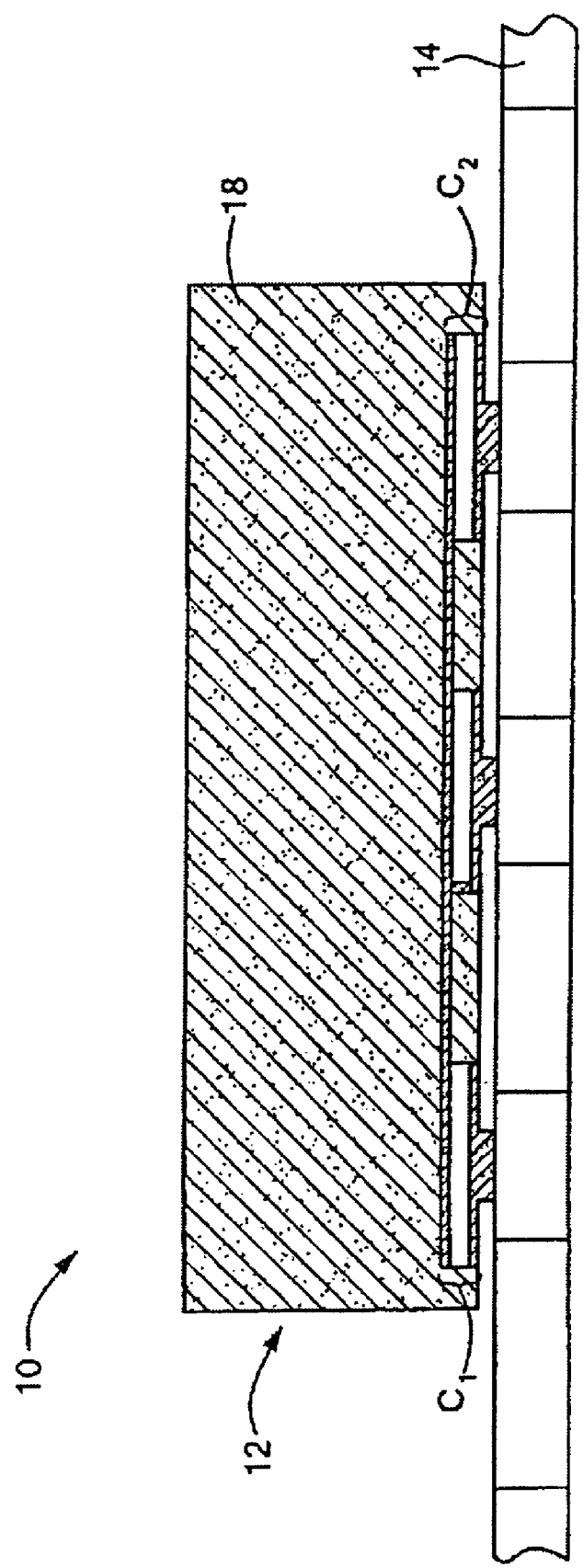
FIG. 6 schematically shows an alternative embodiment of the sensor system, in which the base comprises a package or circuit board.

FIG. 6 schematically shows an alternative embodiment of the sensor system 10, in which the base 14 comprises a package or circuit board. In this and other embodiments, the MEMS chip 12 can have circuitry for performing one or more functions. For example, the substrate 18 can have the above discussed accelerometer functionality. Such circuitry can be wholly on the substrate 18, wholly off-chip, or partially on the substrate 18.

Figure 7:
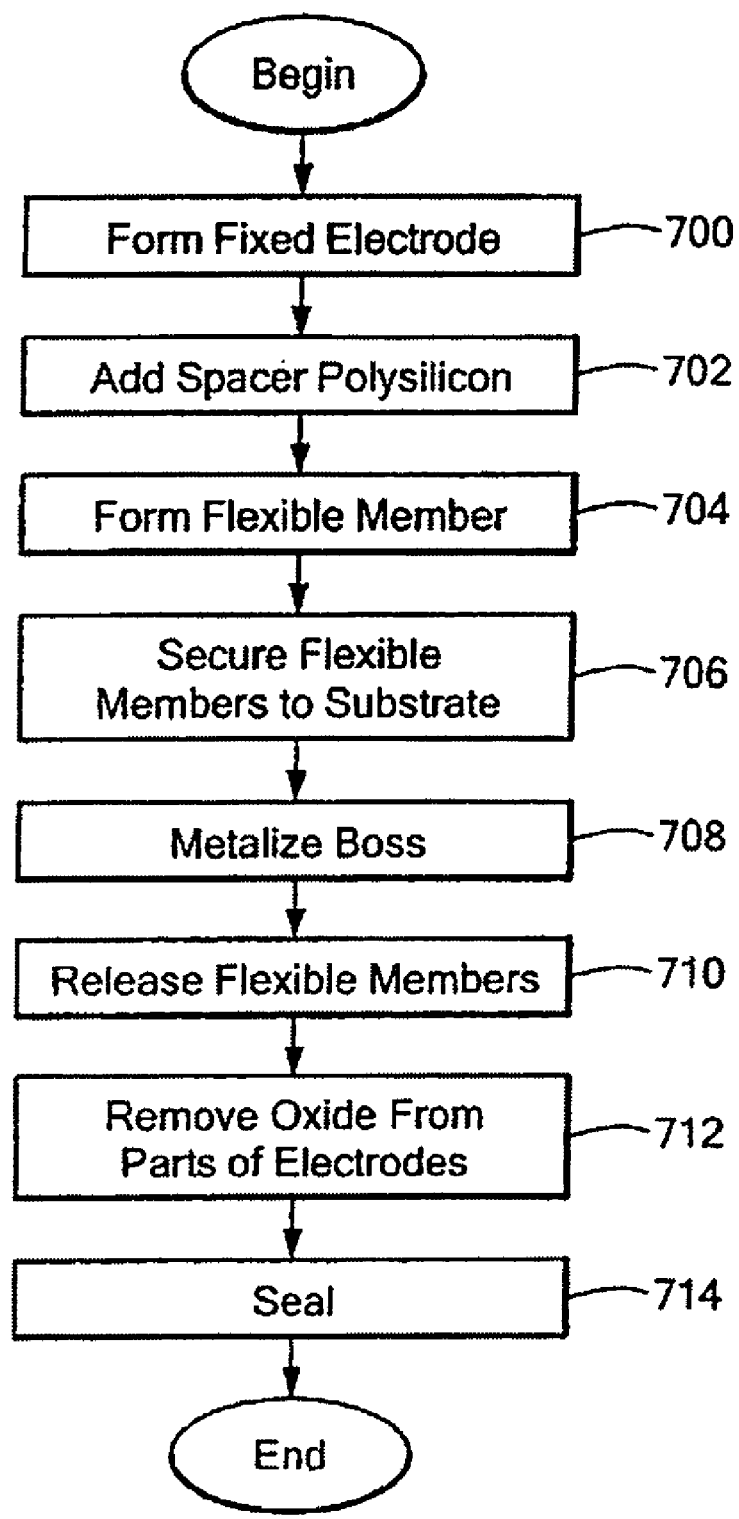
FIG. 7 shows a process of forming the MEMS chip shown in FIG. 1 in accordance with illustrative embodiments of the invention.

In illustrative embodiments, the MEMS chip 12 is formed by processes that use polysilicon as a sacrificial material. Other processes may be used, however, such as those that use oxides as the sacrificial layer (commonly used in surface micromachining and silicon-on-insulator processes). Accordingly, discussion of a specific process is exemplary and not intended to limit various embodiments. FIG. 7 shows one such exemplary process, in which polysilicon is used as the sacrificial material. This process forms a plurality of MEMS chips 12 on a silicon wafer 34. FIGS. 8-12 graphically illustrate this process by showing the MEMS chip 12 at various stages of the production process. Note that FIGS. 8-12 show a partial view of the MEMS chip 12 from just beyond the die center to an opposite end. This view in FIGS. 8-12 is a different cross-sectional view than that shown in FIG. 5 because it shows the communication boss 16 and conductive channel 23 at the center of the die, and only a single flexible member 22 to the left of the die center.

Figure 8:
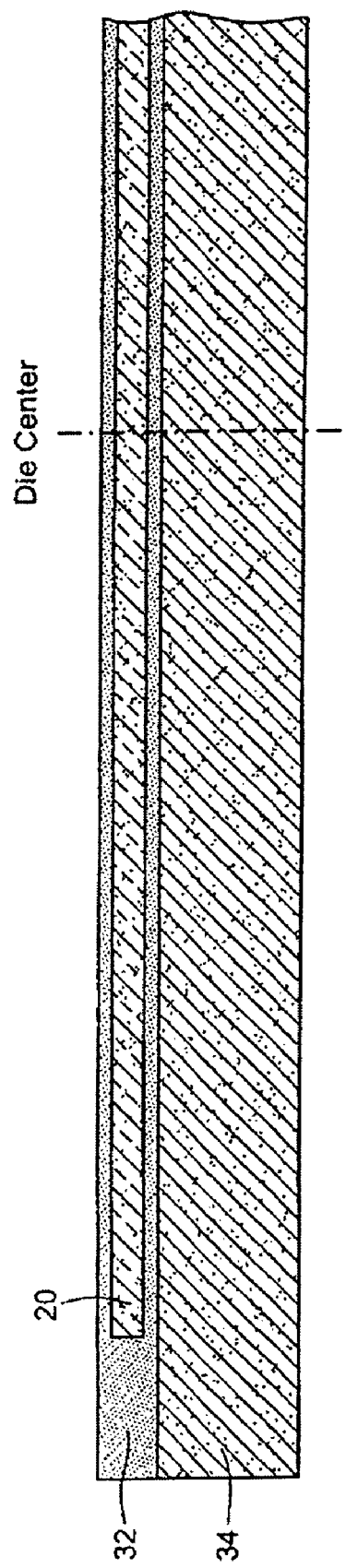
FIG. 8 schematically shows a cross-sectional view of an intermediate MEMS chip device during development to demonstrate step 700 of FIG. 7.

The process begins at step 700 by forming the fixed electrode 20. To that end, as shown in FIG. 8, a thermal oxide 32 is deposited onto a single crystal silicon wafer 34. It should be noted that the Figures generically identify all oxide layers with reference number 32. This generalized identification is for convenience, however, and should not imply that such layers are applied concurrently.

Continuing with the process, after the oxide 32 is deposited, polysilicon is deposited on selected portions of the top surface and patterned to form the fixed electrode 20 and interconnections. Additional thermal oxide 32 (e.g., an additional 1000 Angstrom etch stop) subsequently is deposited over the fixed electrode 20.

Figure 9:
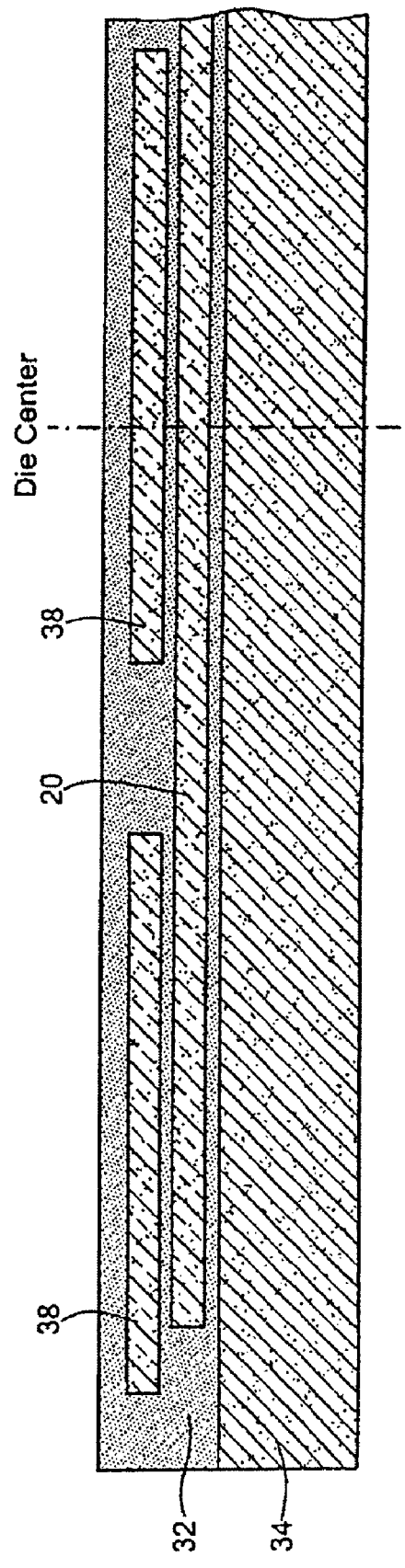
FIG. 9 schematically shows a cross-sectional view of an intermediate MEMS chip device during development to demonstrate step 702 of FIG. 7.

The process then continues to step 702, in which a spacer polysilicon (also known as "sacrificial polysilicon 38" or a "sacrificial layer 38") is deposited onto the top layer of oxide 32, and then covered with another layer of etch stop oxide 32 (see FIG. 9). The oxide may be a PECVD oxide with a thickness that is different from the first etch stop oxide. After the second stop oxide 32 is added, the flexible members 22 may be formed (step 704). To that end, the bosses 16 first may be formed from a first mask, while the diaphragm 24 may be subsequently formed by a second mask (See FIG. 10). In illustrative embodiments, the boss 16 may be about three microns in height (i.e., in a direction that is perpendicular to the face of the wafer 34), while the diaphragm 24 may be about one micron thick.

Figure 10:
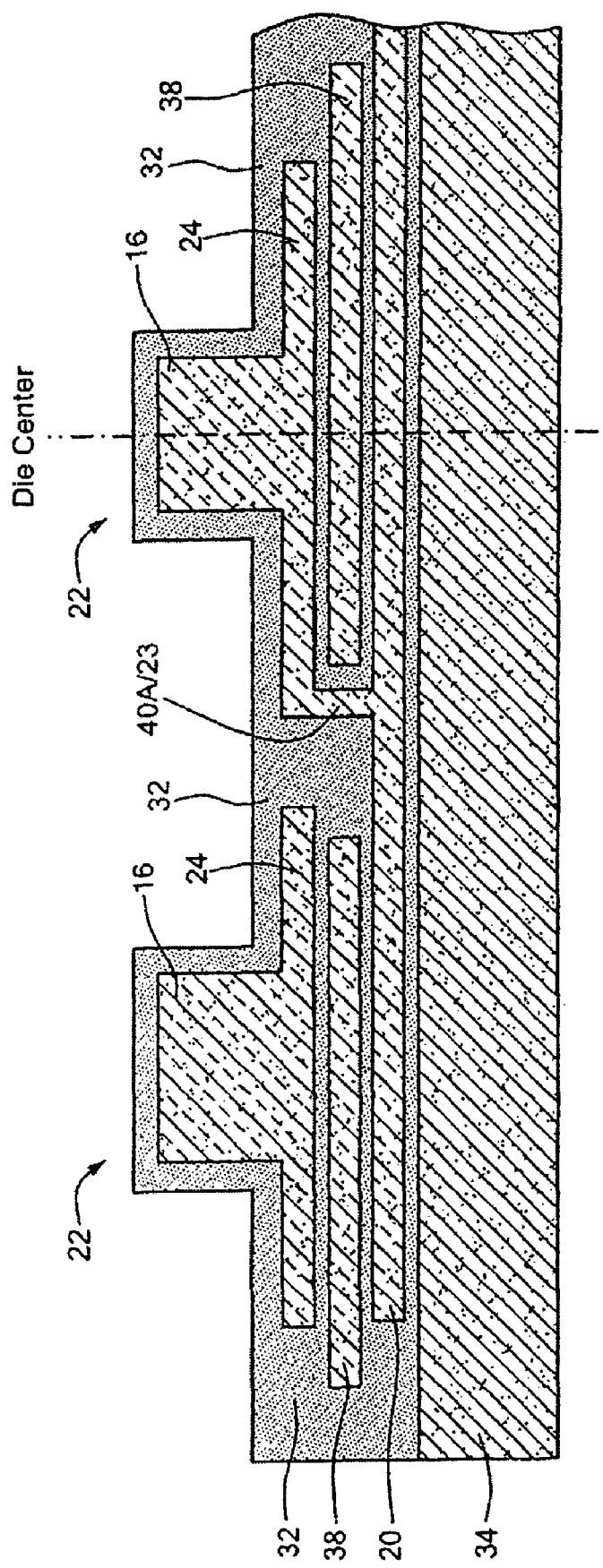
FIG. 10 schematically shows a cross-sectional view of an intermediate MEMS chip device during development to demonstrate steps 704-706 of FIG. 7.

It should be noted that although it has a diaphragm 24, in some embodiments, the conductive channel 23 in the center of the die (and its integral boss 16, i.e., the conductive boss 16) is not released and thus, not flexible. Accordingly, it should not be misconstrued as performing the function of a variable capacitor. In the embodiment shown in FIGS. 8-12, however, the conductive path 23 has a released portion. Also of note in FIG. 10 is a trench 40A etched through the oxide 32 and filled with polysilicon. This polysilicon fill eventually forms part of the conductive path from the communication boss 16 to the fixed electrode 20.

After they are formed, the flexible members 22 are secured to the substrate 18 (step 706). To that end, another etch stop oxide 32 is deposited and patterned about and over the flexible members 22, thus effectively securing the flexible members 22 to the substrate 18 (see FIG. 10).

Figure 11:
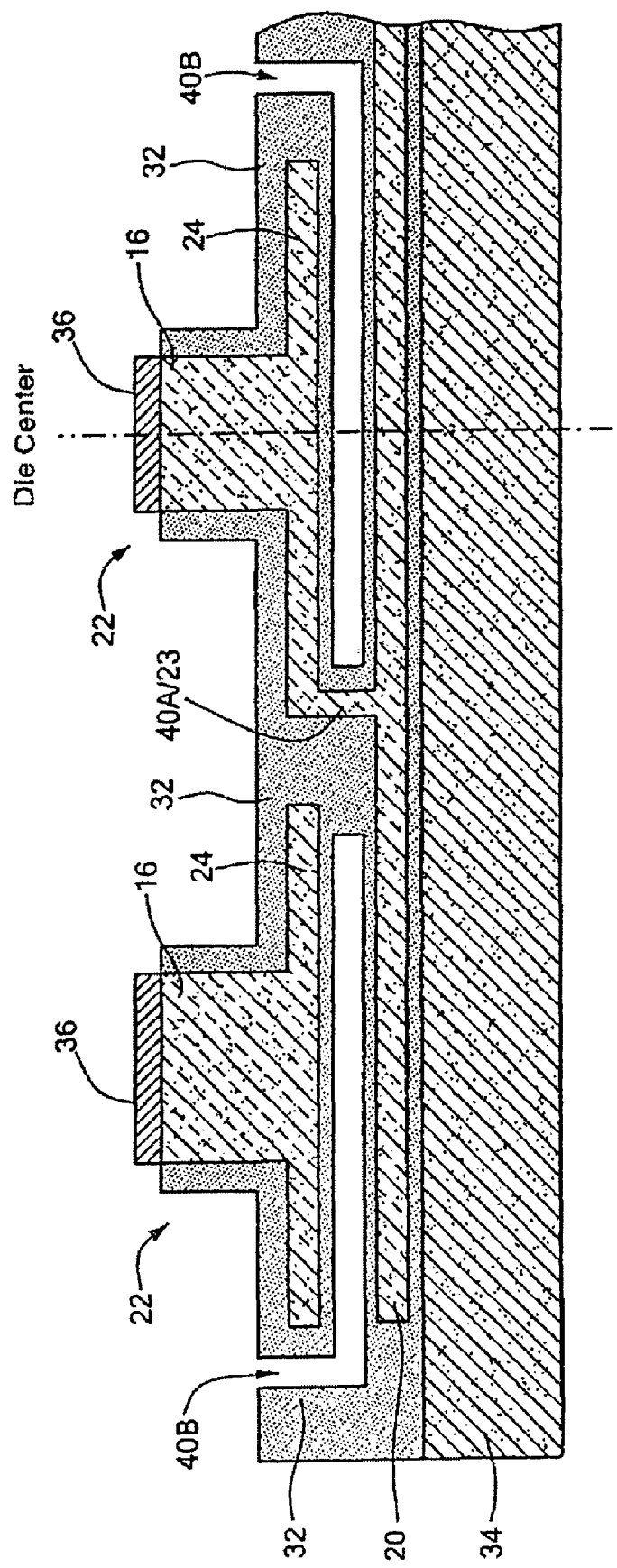
FIG. 11 schematically shows a cross-sectional view of an intermediate MEMS chip device during development to demonstrate steps 708-710 of FIG. 7.

The top surface of the bosses 16 then may be metalized to facilitate connection with interconnecting circuitry (step 708). To that end, as shown in FIG. 11, the oxide 32 on the top surface of each boss 16 may be removed and replaced with a deposited layer of metal.

The process then continues to step 710 by releasing the flexible members 22 (i.e., suspending them from the substrate 18). To that end, trenches 40B may be etched through the oxide 32 to the sacrificial polysilicon layers 38 (see FIG. 11). These openings channel material that removes the sacrificial polysilicon layers 38. In illustrative embodiments, this material is xenon difluoride ($XeF_2$) and implements a dry gas phase etch. This substantially room temperature process removes only the sacrificial polysilicon layers 38 because the oxide layers insulate the other polysilicon layers from the xenon difluoride.

Accordingly, removal of the sacrificial polysilicon layers 38 forms a space 42 bounded by the fixed electrode 20 and oxide 32 on each of the flexible members 22. This space 42 and the opposing electrodes thus form the variable capacitors discussed above. In illustrative embodiments, an additional material is added to the path to remove the thin layer of oxide 32 on those faces of the capacitors (step 712, not shown in FIGS. 8-12). For example, a vapor HF etch may be applied to remove the oxide 32.

Figure 12:
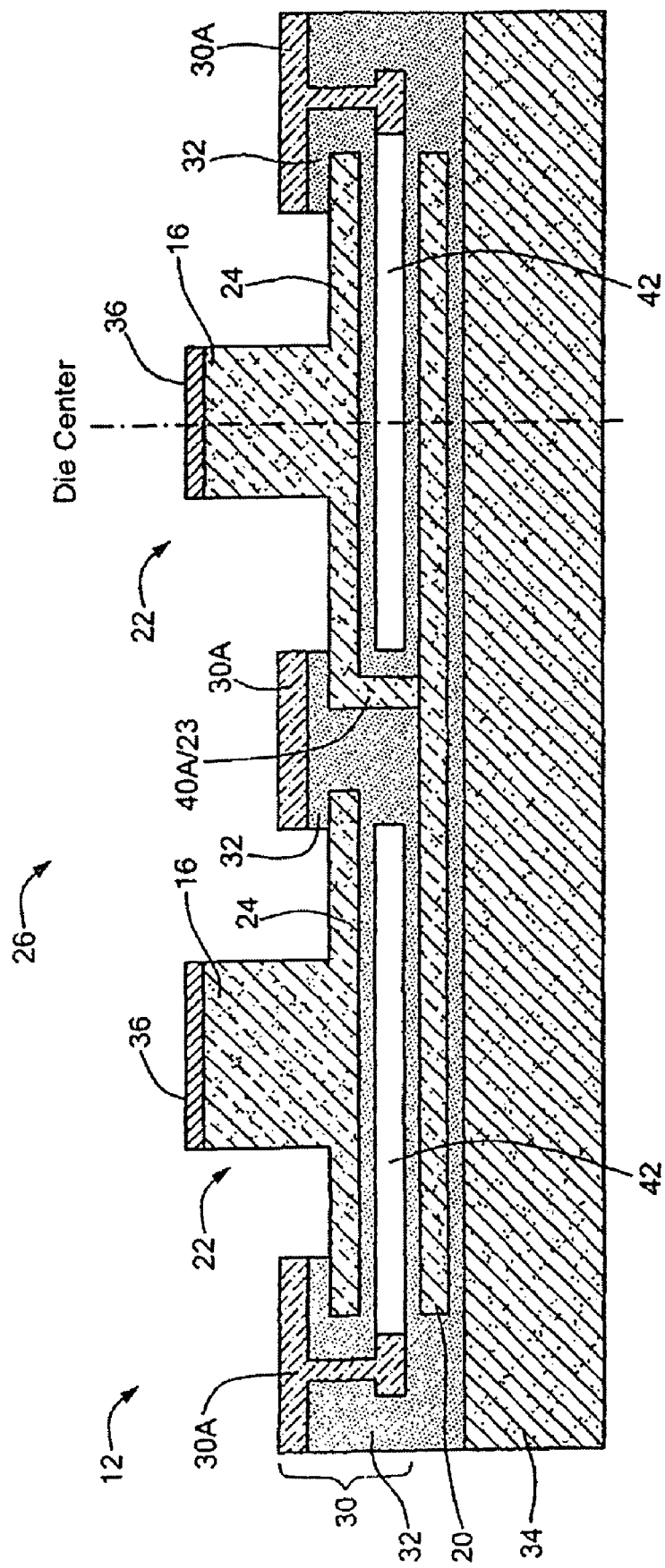
FIG. 12 schematically shows a cross-sectional view of a MEMS chip device during development to demonstrate step 714 of FIG. 7.

After the flexible members 22 are released, the process continues to step 714, in which a passivation layer is added to the trenches 40B used to remove the polysilicon sacrificial layers 38 (see FIG. 12). To that end, the passivation layer 30A may be deposited over the top surface and within those trenches 40B. The passivation layer 30A, combined with the flexible members 22 and bosses 16, thus effectively form a cap (the above noted in-situ cap 30) that hermetically seals the interior of the MEMS chip 12 (i.e., the environmentally sensitive sensor portion), thus completing the process.

It should be noted that various steps in this process may be performed in a different order, while additional steps may be performed (e.g., backgrinding or other post-processing steps). The steps in this process thus were exemplary and may be modified.

This process may be performed on a silicon wafer 34 to form a single MEMS chip, or on a single wafer 34 to form a plurality of MEMS chips. In the latter case, an additional dicing step is performed to form the individual MEMS chips. Of course, after being formed, conventional processes may secure any of the produced MEMS chips to the base 14.

The disclosed sensor system 10 has a wide variety of applications other than those discussed above. For example, among others, one application involves monitoring pressure in automobile tires. Tire pressure monitors typically measure the air pressure in each tire of a vehicle and trigger an alarm if the pressure in one or more tires exceeds specified limits. Because tire monitors are electrically isolated, pressure sensor modules typically transmit pressure signals to the vehicle using wireless technology. These monitors generally are capable of operating for many years and thus, low power is an important requirement. To minimize power, a switch can be incorporated in the modules to deactivate them when the vehicle is not in use. Undesirably, prior art commercial switches suitable for this application often are expensive. Using the disclosed sensor system 10 as a switch should avoid much of this cost. For example, by integrating them on the same chip, the pressure sensor and switch may be produced in the same wafer fabrication process.

Figure 13:
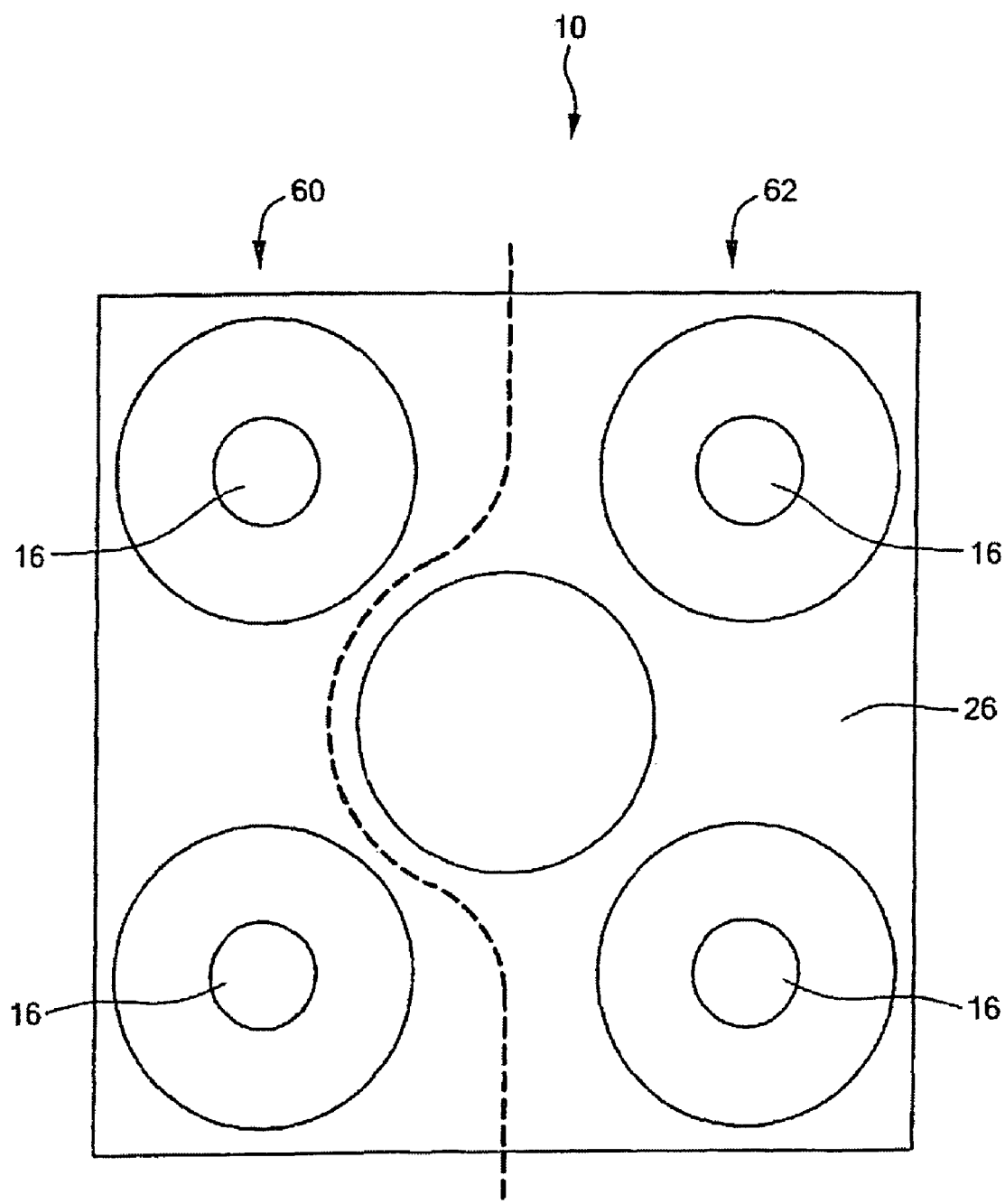
FIG. 13 schematically shows an exemplary implementation of illustrative embodiments of the invention.

FIG. 13 schematically shows an illustrative chip having this functionality. In particular, the chip includes an accelerometer portion 60 implementing a one axis accelerometer, and a pressure sensor portion 62 for detecting pressure within a tire. As discussed above, the accelerometer portion 60 is a capacitive accelerometer, which senses alternating positive and negative gravitational force when the tire rotates. Use of this embodiment allows module power to be reduced if no signal is detected after a predetermined time.

To further minimize power, the pressure sensor portion 62 also may be capacitive. This can be achieved by using a structure that is similar to a switch structure without a boss on its central diaphragm (dimensions may differ to accommodate range requirements). Pressure sensor I/O to the module is accomplished through boss structures 16 on the pressure sensor portion 62 of the chip. Since the pressure sensor, its connections, and the switch are integrated on one chip using the same wafer fabrication process, their combined cost should be little more than the cost of the pressure sensor. One such exemplary process that can be used is described in the U.S. patent application filed Jan. 3, 2005, entitled, "Method of Forming a MEMS Device," assigned to Analog Devices, Inc. of Norwood, Mass., and naming Timothy Brosnihan and Thomas Kieran Nunan as inventors, the disclosure of which is incorporated herein, in its entirety, by reference.

The use of the sensor system 10 in applications similar to tire pressure monitoring has further reliability and cost advantages. For example, many micromachined devices are susceptible to particle contamination because tires are dirty. However, the sensor system 10 hermetically seals its particle-susceptible gaps at the wafer level. In essence, they are "in-situ" capped. Thus, particle failures should be minimized. Similarly, the in-situ cap protects the sensor system 10 from moisture and other undesirable noxious fluids. This feature also allows the wafers to be singulated into discrete die using standard industry processes. Compatibility with industry-standard singulation processes and equipment consequently should give the sensor system 10 a cost advantage over many micromachined products.

The particular geometry of the illustrated flexible members 22 has another advantage with respect to long term reliability. In particular, it is well known that flexures typically are susceptible to fatigue failure under certain conditions. Such failures arise when repeated movement causes a flexure crack that propagates until performance is affected or catastrophic fracture occurs. Such cracks normally initiate at edges and corners. The illustrated flexible members 22, however, wrap continuously around the bosses 16 and thus, they have no comparable edges and corners. Accordingly, each noted flexible member 22 has a substantially angle-less (i.e., not polygonal) outer boundary.

The result is enhanced reliability in an application that subjects linkages to repetitive stresses and strains. Various of the illustrated examples combine a sensing system with its system interconnect. Moreover, various embodiments use a flip chip mounting technique. This mounting technique can be advantageously used in other flip chip applications. For example, solder joint fatigue often is a primary failure mechanism in flip chip mounted IC die after thermal cycling. To mitigate such failures, the industry frequently employs stringent design rules to control bump spacing and size. Additionally, an underfill is often dispensed under the die after mounting. Such measures are expensive and limit design flexibility. Replacing the standard die pads with flex-tolerant flexible members 22 enables high reliability without reliance on tight design constraints and underfill. A flexure such as that illustrated in the center of FIG. 2 is particularly effective in resisting out-of-plane stresses. Corrugated or bending flexures may be preferred when in-plane stresses are the dominant concern.

The disclosed embodiments thus should provide a more robust sensor because less compliant springs can be used. In addition, because relatively low temperature processes form the MEMS structure, on-chip circuitry may be added to the substrate 18 at any point in the process, including before the structure is formed. Moreover, unlike prior art integrated circuits known to the inventors, illustrative embodiments produce an integrated circuit that is capable of operating only after it is mounted to a base of some kind (e.g., a package). In other words, illustrative embodiments are effectively inoperable before they are mounted to a base.

As noted above, this process and various disclosed embodiments are exemplary. Those in the art could apply principles of various embodiments to produce additional embodiments not specifically discussed. For example, it is contemplated that means other than capacitive coupling may be used to detect mass movement. One such means may use a variable resistance to detect movement. In addition, although the figures show flexible diaphragms 24, principles could be applied to other sensors. For example, it is contemplated that one skilled in the art could modify the accelerometer disclosed in the incorporated patent (U.S. Pat. No. 5,939,633) to operate in a manner similar to that disclosed herein. In particular, that accelerometer has a movable structure that can be secured to a base 14 in a manner that suspends the substrate 18. The springs of such an embodiment thus could be made larger to increase robustness.

Although the above discussion discloses various exemplary embodiments of the invention, it should be apparent that those skilled in the art can make various modifications that will achieve some of the advantages of the invention without departing from the true scope of the invention.

What is claimed is:

1. A sensor system comprising:
   a base;
   a substrate; and
   a flexible member suspended from at least a portion of the substrate, at least a portion of the flexible member being capable of moving relative to at least a portion of the substrate, the substrate having a substrate mass, the flexible member having a flexible member mass, the substrate mass being greater than the flexible member mass, the substrate and flexible member being configured to interact to produce a motion signal identifying movement of the base,
   the flexible member being secured to the base, the substrate being movable relative to the base.

2. The sensor system as defined by claim 1 wherein the portion of the flexible member is capable of moving relative to the base.

3. The sensor system as defined by claim 1 wherein the substrate includes an in-situ cap.

4. The sensor system as defined by claim 1 wherein the substrate includes circuitry for detecting motion of the substrate relative to the base.

5. The sensor system as defined by claim 1 further including a conductive boss coupling the flexible member to the base.

6. The sensor system as defined by claim 1 wherein the base includes a semiconductor, an integrated circuit, a package, or a circuit board.

7. The sensor system as defined by claim 1 further including a plurality of additional flexible members suspended from the substrate, the additional flexible members each having an additional flexible member mass, the sum total of the flexible member mass and all additional flexible member masses being less than the substrate mass.

8. The sensor system as defined by claim 1 wherein the substrate and flexible member are a part of a MEMS chip, the flexible member mounting the MEMS chip to the base.

9. The sensor system as defined by claim 1 wherein the flexible member is flip-chip secured to the base.

10. The sensor system as defined by claim 1 wherein the flexible member has a substantially angle-less outer boundary.

11. The apparatus as defined by claim 1 wherein the motion signal is used to measure acceleration.

12. The sensor system as defined by claim 1 wherein the motion signal is used as a switch.

13. The sensor system as defined by claim 1 further including a pressure sensor on the substrate.

14. A method of producing a sensor system, the method comprising:
    forming a MEMS chip having a flexible member suspended from at least a portion of a substrate, at least a portion of the substrate being capable of moving relative to at least a portion of the flexible member, the flexible member having a flexible member mass, the substrate having a substrate mass, the substrate mass being greater than the flexible member mass; and coupling the flexible member with a base so that the substrate is movable relative to the base.

15. The method as defined by claim 14 further comprising forming a pressure sensor on the MEMS chip.

16. The method as defined by claim 14 wherein the flexible member has a surface facing the base, the method further comprising:

forming a mounting member on the flexible member surface facing the base, coupling comprising securing the mounting member to the base.

17. The method as defined by claim 14 further wherein forming includes forming circuitry on the substrate before suspending the flexible member from at least a portion of the substrate.

18. The method as defined by claim 14 further comprising forming a conductive plate on the substrate, the conductive plate and flexible member together forming a varying capacitor.

19. The method as defined by claim 14 further comprising forming a conductive plate on the substrate, the conductive plate and base together forming a varying capacitor.

20. A sensor system comprising:

a base;

a substrate; and means for movably securing the substrate to the base, the securing means being suspended from at least a portion of the substrate, at least a portion of the securing means being capable of moving relative to the substrate, the substrate having a substrate mass, the securing means having a securing means mass, the substrate mass being greater than the securing means mass, movement of the substrate producing a motion signal identifying movement of the base, the substrate being movable relative to the base.

21. The sensor system as defined by claim 20 wherein the securing means includes a flexible member.

22. The sensor system as defined by claim 21 wherein the securing means includes a flexible member and a conductive boss, the boss coupling the flexible member to the base.

23. The sensor system as defined by claim 20 wherein the substrate and securing means include means for sensing motion of the substrate relative to the base.

24. A flip chip apparatus comprising:

a base;

a substrate comprising an integrated circuit chip; and a flexible member suspended from at least a portion of the substrate, at least a portion of the flexible member being capable of moving relative to at least a portion of the substrate, the substrate having a substrate mass, the flexible member having a flexible member mass, the substrate mass being greater than the flexible member mass, the flexible member being secured to the base, the substrate being movable relative to the base, the flexible member being conductive and electrically coupling the substrate to the base.

* * * * *